(12) United States Patent
Jeon et al.

(10) Patent No.: US 7,944,311 B1
(45) Date of Patent: May 17, 2011

(54) FEEDBACK BIASING FOR CASCODE AMPLIFIERS

(75) Inventors: Hamhee Jeon, Atlanta, GA (US); Chang-Ho Lee, Marietta, GA (US); Joy Laskar, Marietta, GA (US)

(73) Assignees: Samsung Electro-Mechanics Company, Ltd. (KR); Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 12/641,052

(22) Filed: Dec. 17, 2009

(51) Int. Cl.
*H03F 3/04* (2006.01)
(52) U.S. Cl. ........................ 330/311; 330/310
(58) Field of Classification Search .......... 330/310–311, 330/98, 133, 150, 302
See application file for complete search history.

(56) References Cited

U.S. PATENT DOCUMENTS

| | | | |
|---|---|---|---|
| 7,489,201 B2 * | 2/2009 | Sarkar et al. | 330/311 |
| 7,646,252 B2 * | 1/2010 | Banba | 330/311 |

OTHER PUBLICATIONS

Sowlati et al., "A 2.4-GHz 0.18-um CMOS Self-Biased Cascode Power Amplifier." IEEE Journal of Solid-State Circuits. vol. 38, No. 8, Aug. 2003. 1318-1324.

* cited by examiner

*Primary Examiner* — Robert Pascal
*Assistant Examiner* — Hieu P Nguyen
(74) *Attorney, Agent, or Firm* — Sutherland Asbill & Brennan LLP

(57) ABSTRACT

A system for a power transmitter may be provided. The system may include a first amplifier stage having at least a first transistor and a second transistor that are connected in a first cascode configuration; a second amplifier stage having at least a third transistor and a fourth transistor that are connected in a second cascode configuration, where the first transistor receives a system input of the power transmitter, where the second transistor is connected to the third transistor, and where the fourth transistor provides a system output of the power transmitter; and a feedback network that connects a first gate or base of the fourth transistor with a second gate or base of the second transistor.

20 Claims, 4 Drawing Sheets

US 7,944,311 B1

FEEDBACK BIASING FOR CASCODE AMPLIFIERS

FIELD OF INVENTION

Embodiments of the invention relate generally to cascode amplifiers, more particularly, to feedback biasing for cascode amplifiers in a power transmitter system.

BACKGROUND OF THE INVENTION

In complementary metal oxide semiconductor (CMOS) power amplifier design, there are two main issues: (1) voltage stress reduction for power amplifier's reliability and (2) linearity improvement. The voltage stress of a device can lead to oxide breakdown and hot carrier effects, and can increase the threshold voltage and degrade the performance of the device. Also, CMOS technology has an inherent linearity problem because of a number of parasitic capacitances. Accordingly, there is a need for feedback biasing for cascode amplifier.

BRIEF SUMMARY OF THE INVENTION

According to example embodiment of the invention, there is a system for a power transmitter. The system may include a first amplifier stage having at least a first transistor and a second transistor that are connected in a first cascode configuration; a second amplifier stage having at least a third transistor and a fourth transistor that are connected in a second cascode configuration, where the first transistor receives a system input of the power transmitter, where the second transistor is connected to the third transistor, and where the fourth transistor provides a system output of the power transmitter; and a feedback network that connects a first gate or base of the fourth transistor with a second gate or base of the second transistor.

According to another example embodiment of the invention, there is another system for a power transmitter. The system may include a first amplifier stage having at least a first transistor and a second transistor that are connected in a first cascode configuration; a second amplifier stage having at least a third transistor and a fourth transistor that are connected in a second cascode configuration, where the first transistor receives a system input of the power transmitter, where the second transistor is connected to the third transistor, and where the fourth transistor provides an system output of the power transmitter; and means for feeding one or more parasitic signals from a first gate or base of the fourth transistor as a feedback signal to a second gate or base of the second transistor.

BRIEF DESCRIPTION OF THE DRAWINGS

Figure 1:
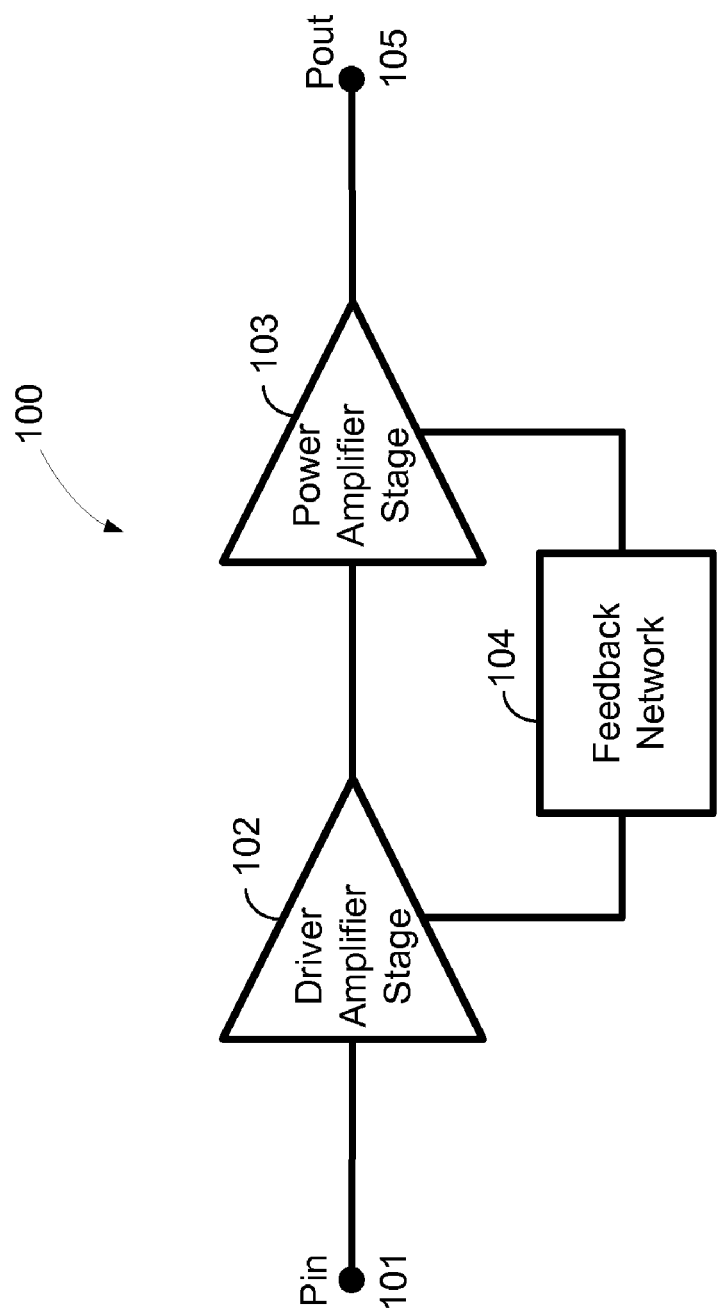

Having thus described the invention in general terms, reference will now be made to the accompanying drawings, which are not necessarily drawn to scale, and wherein:

FIG. 1 illustrates an example simplified power transmitter system that utilizes feedback biasing for cascode amplifiers, according to an example embodiment of the invention.

Figure 2:
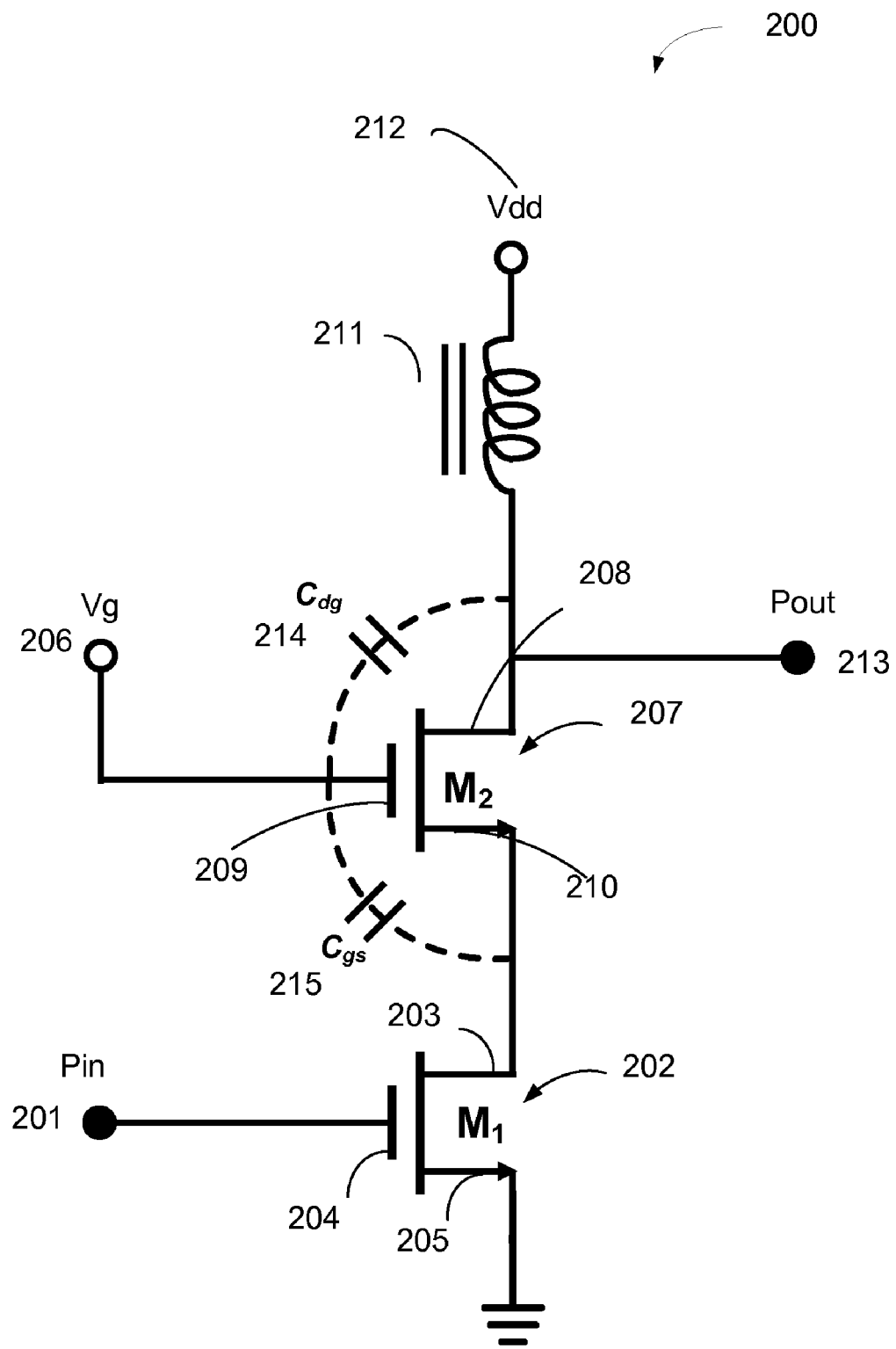

FIG. 2 illustrates a schematic diagram of a cascode amplifier system that illustrates parasitic capacitances of a common-gate transistor, according to an example embodiment of the invention.

Figure 3:
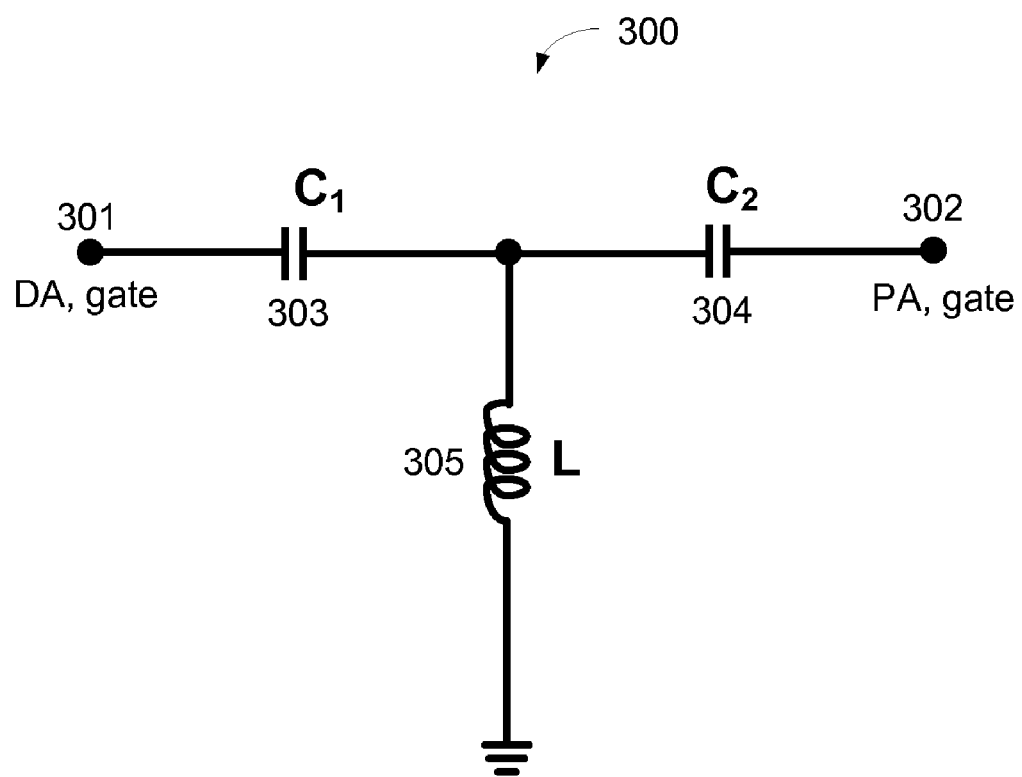

FIG. 3 illustrates a schematic diagram for an example power transmitter system that utilizes feedback biasing for cascode amplifiers, according to an example embodiment of the invention.

Figure 4:
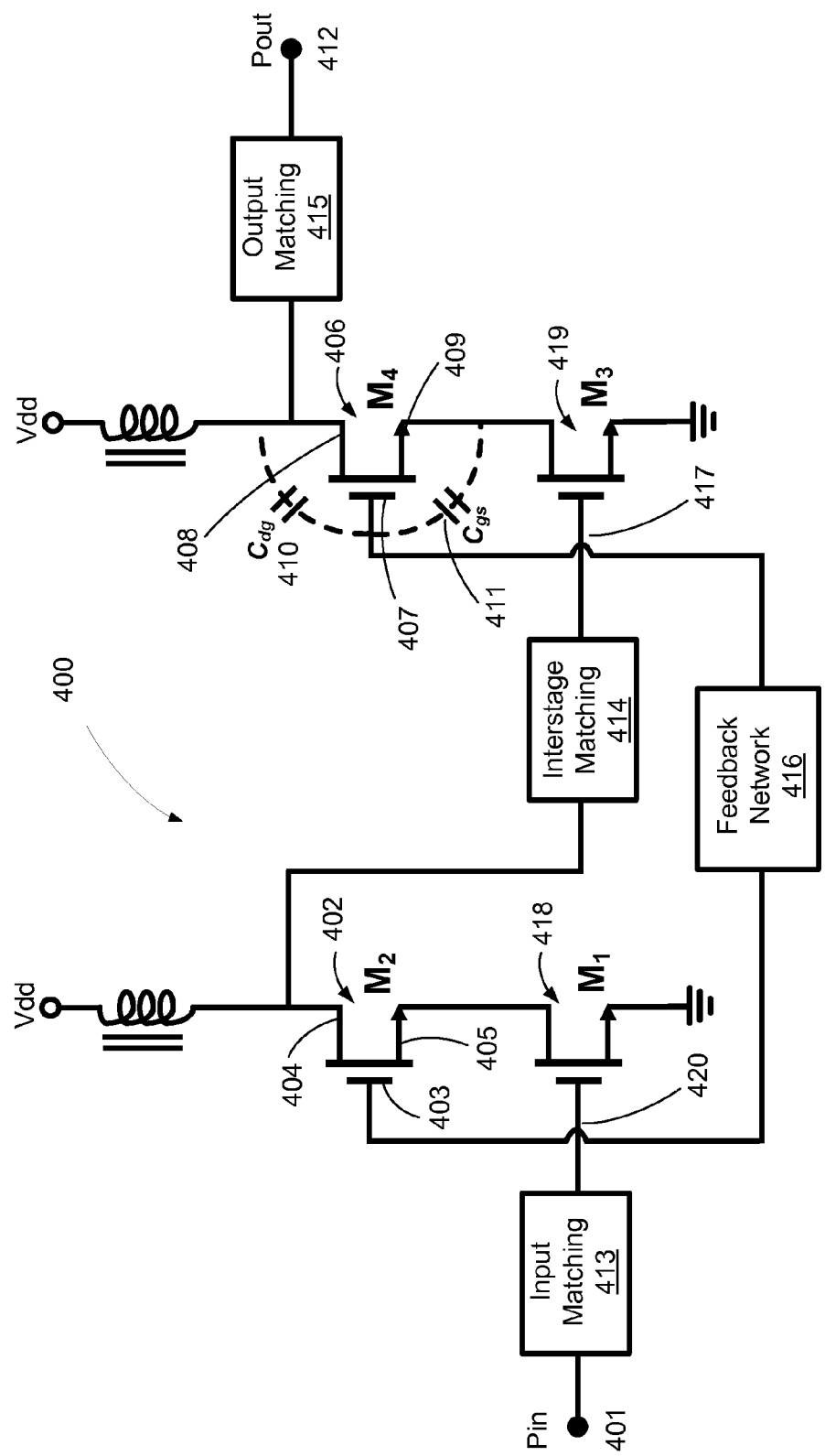

FIG. 4 illustrates an example schematic diagram of an example feedback network, according to an example embodiment of the invention.

DETAILED DESCRIPTION OF THE INVENTION

Example embodiments of the invention now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Embodiments of the invention may provide for a power transmitter system that may include a first cascode amplifier stage (e.g., a driver amplifier stage) and a second cascode amplifier stage (e.g., a power amplifier stage). In an example embodiment of the invention, the first cascode amplifier stage may include a first transistor configured as a common source amplifier, and a second transistor configured as a common gate amplifier. Likewise, the second cascode amplifier stage may include a third transistor configured as a common source amplifier, and a fourth transistor configured as a common gate amplifier. The power transmitter system may also include a feedback network that is connected between the gate of the common-gate amplifier in the first cascode amplifier stage and the gate of common-gate amplifier in the second cascode amplifier stage. The feedback network may be operative to provide parasitic signals from the gate of the common-gate amplifier in the second cascode amplifier stage as a feedback signal to the gate of the common-gate amplifier in the first cascode amplifier stage. The use of the feedback signal allows the power transmitter system to have less cutoff region and linear region while having more saturation region, thereby reducing operational variations of the power transmitter system. In other words, the operational cycle of the power transmitter system falls more into the saturation region and works less on the cutoff region compared to conventional power amplifiers. In addition, the use of the feedback signal allows the voltage of the common-gate amplifier in the first cascode amplifier stage to generally follow the output voltage of the power transmitter system (provided by the common-gate amplifier in the second cascode amplifier stage), thereby reducing the voltage stress of the common-gate amplifier in the first cascode amplifier stage.

It will be appreciated that example embodiments of the inventions may be illustratively described herein with respect to field effect transistors (FETs) having respective sources, gates, and drains. However, it will also be appreciated that other types of transistors may likewise be utilized instead of FETs, including bipolar junction transistors (BJTs) having respective emitters, bases and collectors. Thus, example sources, gates, and drains for FETs may correspond to respective emitters, bases, and collectors for BJTs. Likewise, common-source amplifiers utilizing FETs as described herein may be substituted with common-emitter amplifiers utilizing BJTs, according to an example embodiment of the invention. Similarly, common-gate amplifiers utilizing FETs as described herein may be substituted with common-base amplifiers utilizing BJTs, according to an example embodiment of the invention.

FIG. 1 illustrates an example simplified power transmitter system 100 that utilizes feedback biasing for cascode amplifiers, according to an example embodiment of the invention. As shown in FIG. 1, there may be a driver amplifier stage 102, a power amplifier stage 103, and a feedback network 104. According to an example embodiment of the invention, the driver amplifier stage 102 may receive a system 100 input such as a baseband signal or a radio frequency (RF) signal from the input port 101, and may generate a first stage output to drive the power amplifier stage 103. The power amplifier stage 103 may provide an amplified output signal to the output port 105, which may provide the system 100 output.

As will be described herein, the driver amplifier stage 102 may include a first cascode amplifier stage, and the power amplifier stage 103 may include a second cascode amplifier stage. The first cascode amplifier stage may include a first transistor configured as a common source amplifier, and a second transistor configured as a common gate amplifier. Likewise, the second cascode amplifier stage may include a third transistor configured as a common source amplifier, and a fourth transistor configured as a common gate amplifier.

In FIG. 1, the feedback network 104 may feed back the common-gate parasitic signal of power amplifier stage 103 as a feedback signal to the common-gate of driver amplifier stage 102, according to an example embodiment of the invention. The use of the feedback signal allows the power transmitter system 100 to have less cutoff region and linear region while having more saturation region, thereby reducing operational variations of the power transmitter system. In other words, the operational cycle of the power transmitter system 100 falls more into the saturation region and works less on the cutoff region compared to conventional power amplifiers. In addition, the use of the feedback signal allows the voltage of the common-gate amplifier in the driver amplifier stage 102 to generally follow the output voltage of the power transmitter system 100 (provided by the common-gate amplifier in the power amplifier stage 103), thereby reducing the voltage stress of the common-gate amplifier in the driver amplifier stage, according to an example embodiment of the invention.

FIG. 2 illustrates a schematic diagram of a cascode amplifier system 200 that illustrates parasitic capacitances of a common-gate transistor, according to an example embodiment of the invention. It will be appreciated that the cascode amplifier system 200 may be utilized for the power amplifier stage 103 in FIG. 1, and similarly for the driver amplifier stage 102 in FIG. 1. In FIG. 2, the cascode amplifier system 200 may include a common-source device or transistor 202 ($M_1$) having a first source 205, a first gate 204, and a first drain 203, according to an example embodiment of the invention. Likewise, the cascode power amplifier system 200 may also include a second common-gate transistor or device 207 ($M_2$) having a second source 210, a second gate 209, and a second drain 208, according to an example embodiment of the invention.

According to an example embodiment of the invention, the first common-source device 202 ($M_1$) may be connected in series with the second common-gate device 207 ($M_2$) to reduce the voltage stress or burden that may otherwise be borne by a single device. According to an example embodiment of the invention, the devices 202 ($M_1$), 207 ($M_2$) may be connected in series by connecting the first drain 203 of the first common-source device 202 ($M_1$) to the second source 210 of the second common-gate device 207 ($M_2$). Further, the first source 205 of the first common-source device 202 ($M_1$) may be connected to ground (GND) while the second gate 209 of the second common-gate device 207 ($M_2$) may be connected to a gate bias port 206 (Vg). As will be described herein, the gate bias port 206 (Vg) may be connected to a feedback network. According to an example embodiment of the invention, an input port 201 (Pin) for cascode amplifier system 200 may be provided at the first gate 204 of the first common-source device 202 ($M_1$). Likewise, an output port 213 (Pout) for the cascode amplifier system 200 may be provided at the second drain 208 of the second common-gate device 207 ($M_2$). According to an example embodiment of the invention, an RF choke 211 may also be provided between a DC voltage source or power supply 212 (Vdd) and the second drain 208. The RF choke 211 may be operative to feed DC power to the second drain 208.

During operation of the cascode amplifier system 200, parasitic capacitances may be unavoidable. Thus, a drain-to-gate parasitic capacitance 214 (Cdg) may exist between a second drain 208 and a second gate 209 of the second common-gate device 207 ($M_2$), and a gate-to-source capacitance 411 (Cgs) may exist between the second gate 209 and the second source 210. Accordingly, parasitic signals may be present at the second gate 209 based upon the parasitic capacitances 214 (Cdg) and 411 (Cgs) coupling to the respective second drain 408 and second source 409.

FIG. 3 illustrates a schematic diagram for an example power transmitter system 300 that utilizes feedback biasing for cascode amplifiers, according to an example embodiment of the invention. It will be appreciated that the example power transmitter system 300 in FIG. 3 may be an example implementation of the simplified power transmitter system 100 in FIG. 1.

In FIG. 3, the power transmitter system 300 may include a first (e.g., driver) amplifier stage that includes a first common-source device or transistor 318 ($M_1$) and a second common-gate device transistor 302 ($M_2$) arranged in a cascode configuration. Likewise, the system 300 may include a second (e.g., power) amplifier stage that includes a third common-source device or transistor 319 ($M_3$) and a fourth common-gate device or transistor 306 ($M_4$) that is arranged in a cascode configuration.

The gate of the first common-source device or transistor 318 ($M_1$) may be connected to the input port 301 (Pin) via an input matching network 313. The input matching network 313 may provide impedance matching to a prior stage. The input port 301 (Pin) may receive an analog (e.g., baseband) signal or an analog signal, according to an example embodiment of the invention. The amplified output signal of the first common-source device or transistor 318 ($M_1$) may be provided at the drain of the first common-source device or transistor 318 ($M_1$). Since the drain of the first common-source device or transistor 318 ($M_1$) is connected to the source 305, the second common-gate device or transistor 302 ($M_2$) may receive the amplified output signal via the source 305. The first stage output may be provided by the drain 304 of the second common-gate device or transistor 302 ($M_2$). An RF choke 350 may be operative to feed DC power from a DC voltage source Vdd or power supply to the drain 304.

The first stage output from the drain 304 may be provided to the gate of the third common-source device or transistor 319 ($M_3$) of the second amplifier stage via an interstage matching network 314. The interstage matching network 314 may provide impedance matching between the first amplifier stage and the second amplifier stage. The amplified output signal of the third common-source device or transistor 319 ($M_3$) may be provided at the drain of the third common-source device or transistor 319 ($M_3$). Since drain of the third common-source device or transistor 319 ($M_3$) is connected to the source 309 of the fourth common-gate device or transistor 306 ($M_4$), the fourth common-gate device or transistor 306 ($M_4$) may receive the amplified output signal via the source 309. The drain 308 of the fourth common-gate device or transistor 306 ($M_4$) may be connected to the output port 312 (Pout) via an output matching block 315. The output matching block 315 may provide impedance matching to a subsequent stage. In addition, an RF choke 352 may be operative to feed DC power from voltage source Vdd or power supply to the drain 308.

In an example embodiment of the invention, a feedback network 316 may be used to provide feedback biasing using parasitic capacitances as well as to provide an AC virtual ground to the gates of the second common-gate device or transistor 302 ($M_2$) and the second common-gate device or transistor 306 ($M_4$). To do so, the feedback network 316 may connect the gate 307 of the fourth common-gate device or transistor 306 ($M_4$) with the gate 303 of the first common-source device or transistor 318 ($M_1$). The feedback network 316 may transfer parasitic signals at the gate 307 of the second common-gate device or transistor 306 ($M_4$) as a feedback signal to the gate 303 of the second common-gate device or transistor 302 ($M_2$) with appropriate phase, according to an example embodiment of the invention. Indeed, the phase of the feedback signal may provide for cancellation of at least a portion of the parasitic signals present at the gate 303 of the second common-gate device or transistor 302 ($M_2$). It will be appreciated that the parasitic signals may be present at the gate 307, where the parasitic signals are transferred from the from one or both of (i) the source 309 of the second common-gate device 306 ($M_4$) by the parasitic gate-to-source capacitance 311 (Cgs) or (ii) the drain 308 of the second common-gate device 306 ($M_4$) by the drain-to-gate parasitic capacitance 310 (Cdg).

It will be appreciated that since the feedback network 316 is not connected to the signal path (e.g., any system input or output ports) of the power transmitter system 300, the feedback provided by the feedback network 316 may have only a secondary impact on the performance of the power transmitter system 300. It will be appreciated that the input matching block 313, the interstage matching network 314, and the output matching block 315 may be configured to provide for maximum power transfer from the input port 301 (Pin) to the output port 312 (Pout) for the power transmitter system 300.

FIG. 4 illustrates an example schematic diagram 400 of an example feedback network, according to an example embodiment of the invention. The example feedback network of FIG. 4 may be utilized as an implementation of the feedback network 316 described with respect to FIG. 3, or the feedback network 104 described with respect to FIG. 1.

As shown in FIG. 4, the feedback network may include an inductor 405 (L) and two capacitors 403 ($C_1$) and 404 ($C_2$), which may be arranged in a T-configuration, according to an example embodiment of the invention. More specifically, a first end of the capacitor 403 ($C_1$) may be connected to the gate 303 of second common-gate device or transistor 302 ($M_2$) in the driver amplifier stage, while a second end of the capacitor 403 ($C_1$) may be connected to common node 406. Likewise, a first end of the capacitor 404 ($C_2$) may be connected to the gate 307 of the second common-gate device or transistor 306 ($M_4$) in the power amplifier stage, while a second end of the capacitor 404 ($C_2$) may be connected to the common node 406. The inductor 405 (L) may have a first end connected to the common node 406, and a second end connected to ground (GND). It will be appreciated that while capacitors 403, 404 and inductor 405 have been illustrated as individual components, they may likewise include multiple components without departing from example embodiments of the invention. For example, inductor 405 may actually include two or more inductors without departing from example embodiments of the invention.

Still referring to FIG. 4, it will be appreciated that the capacitors 403, 404 in conjunction with the inductor 405 may provide a path for transferring parasitic signals at the gate 307 of the second common-gate device or transistor 306 ($M_4$) as a feedback signal to the gate 303 of the second common-gate device or transistor 302 ($M_2$) with appropriate phase, as described herein, according to an example embodiment of the invention. Likewise, the capacitors 403, 404, which are connected to the inductor 405 that is connected to ground, may provide an AC ground to the gates 303, 307 of second common-gate device or transistor 302 ($M_2$) and the second common-gate device or transistor 306 ($M_4$).

Many modifications and other embodiments of the invention set forth herein will be apparent having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A system for a power transmitter, comprising:
   a first amplifier stage having at least a first transistor and a second transistor that are connected in a first cascode configuration;
   a second amplifier stage having at least a third transistor and a fourth transistor that are connected in a second cascode configuration, wherein the first transistor receives a system input of the power transmitter, wherein the second transistor is connected to the third transistor, and wherein the fourth transistor provides a system output of the power transmitter; and
   a feedback network that connects a first gate or base of the fourth transistor with a second gate or base of the second transistor.

2. The system of claim 1, wherein the feedback network includes at least two capacitors and an inductor.

3. The system of claim 2, wherein the at least two capacitors includes a first capacitor and a second capacitor, wherein the first capacitor, the second capacitor, and the inductor each have a respective first end and a respective second end, wherein the first end of the first capacitor is connected to the first gate or base of the fourth transistor, wherein the second end is connected to a node that is commonly connected to the first end of the second capacitor and the first end of the inductor, wherein the second end of the second capacitor is connected to the second gate or base of the second transistor, wherein the second end of the inductor is connected to ground.

4. The system of claim 1, wherein the feedback network is operative to provide a feedback signal to the second gate or base of the second transistor, the feedback signal based upon one or more parasitic signals present at the first gate or base of the fourth transistor.

5. The system of claim 4, wherein the one or more parasitic signals are based upon at least one of (i) a drain-to-gate capacitance or (ii) a gate-to-source capacitance, associated with the fourth transistor.

6. The system of claim 4, wherein the feedback network is further operative to provide an AC ground for both of (i) the second gate or base of the second transistor and (ii) the first gate or base of the fourth transistor.

7. The system of claim 1, wherein the first transistor, the second transistor, the third transistor, and the fourth transistor comprise either (i) field effect transistors (FETs) having respective gates, sources, and drains, or (ii) bipolar junction transistors (BJTs) having respective bases, emitters, and collectors.

8. The system of claim 1, wherein the first transistor and the third transistor are common source amplifiers or common emitter amplifiers, and wherein the second transistor and the fourth transistor are common gate amplifiers or common base amplifiers.

9. The system of claim 1,
wherein the first transistor includes a fourth gate or base and a first drain or collector, wherein the second transistor includes a second source or emitter, and a second drain or collector, wherein the third transistor includes a third gate or base, and a third drain or collector, and wherein the fourth transistor includes a fourth source or emitter, and a fourth drain or collector,
wherein the fourth gate or base receives the system input of the power transmitter, wherein the first drain or collector is connected to the second source or emitter, wherein the second drain or collector is connected to the third gate or base, wherein the third drain or collector is connected to the fourth source or emitter, and wherein the fourth drain or collector provides the system output of the power transmitter.

10. The system of claim 9, further comprising:
an interstage matching network that connects the second drain or collector to the third gate or base;
an input matching network that provides the system input to the fourth gate or base; and
an output matching network that receives the system output from the fourth drain or collector.

11. The system of claim 9,
wherein the first transistor further includes a first source or emitter that is connected to ground,
wherein the second drain or collector is further connected to a DC power supply,
wherein the third transistor further includes a third source or emitter that is connected to ground, and
wherein the fourth drain or collector is further connected to the DC power supply.

12. The system of claim 1, wherein the first amplifier stage is a driver amplifier stage, and wherein the second amplifier stage is a power amplifier stage.

13. A system for a power transmitter, comprising:
a first amplifier stage having at least a first transistor and a second transistor that are connected in a first cascode configuration;
a second amplifier stage having at least a third transistor and a fourth transistor that are connected in a second cascode configuration, wherein the first transistor receives a system input of the power transmitter, wherein the second transistor is connected to the third transistor, and wherein the fourth transistor provides a system output of the power transmitter; and means for feeding one or more parasitic signals from a first gate or base of the fourth transistor as a feedback signal to a second gate or base of the second transistor.

14. The system of claim 13, wherein the one or more parasitic signals are based upon at least one of (i) a drain-to-gate capacitance or (ii) a gate-to-source capacitance, associated with the fourth transistor.

15. The system of claim 13, wherein the means is further operative to provide an AC ground for both of (i) the second gate or base of the second transistor and (ii) the first gate or base of the fourth transistor.

16. The system of claim 13, wherein the first transistor, the second transistor, the third transistor, and the fourth transistor comprise either (i) field effect transistors (FETs) having respective gates, sources, and drains, or (ii) bipolar junction transistors (BJTs) having respective bases, emitters, and collectors.

17. The system of claim 13, wherein the first transistor and the third transistor are common source amplifiers or common emitter amplifiers, and wherein the second transistor and the fourth transistor are common gate amplifiers or common base amplifiers.

18. The system of claim 13, wherein the first transistor includes a fourth gate or base and a first drain or collector, wherein the second transistor includes a second source or emitter, and a second drain or collector, wherein the third transistor includes a third gate or base, and a third drain or collector, and wherein the fourth transistor includes a fourth source or emitter, and a fourth drain or collector,
wherein the fourth gate or base receives the system input of the power transmitter, wherein the first drain or collector is connected to the second source or emitter, wherein the second drain or collector is connected to the third gate or base, wherein the third drain or collector is connected to the fourth source or emitter, and wherein the fourth drain or collector provides the system output of the power transmitter.

19. The system of claim 18, further comprising:
an interstage matching network that connects the second drain or collector to the third gate or base;
an input matching network that provides the system input to the fourth gate or base; and
an output matching network that receives the system output from the fourth drain or collector.

20. The system of claim 18, wherein the first transistor further includes a first source or emitter that is connected to ground,
wherein the second drain or collector is further connected to a DC power supply,
wherein the third transistor further includes a third source or emitter that is connected to ground, and
wherein the fourth drain or collector is further connected to the DC power supply.

* * * * *